US 6,633,246 B1

(12) United States Patent
Bowers

(10) Patent No.: US 6,633,246 B1
(45) Date of Patent: Oct. 14, 2003

(54) CONVERTER CIRCUIT WITH REDUCED AREA SWITCH COMPENSATION RESISTANCE

(75) Inventor: Derek F. Bowers, Los Altos Hills, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/273,019

(22) Filed: Oct. 16, 2002

(51) Int. Cl.[7] .................................... H03M 1/00
(52) U.S. Cl. ......................... 341/136; 341/144
(58) Field of Search ................. 341/144, 136, 341/145, 150

(56) References Cited

U.S. PATENT DOCUMENTS 4,811,017 A * 3/1989 Gulczynski .............. 341/145
5,119,095 A * 6/1992 Asazawa ................ 341/154
5,307,065 A * 4/1994 Tokuhiro ................ 341/153
6,310,567 B1 * 10/2001 Copley et al. ............ 341/139

OTHER PUBLICATIONS

Cecil, James B., A CMOS 10–Bit D/A Converter, Feb. 1974, pp. 196–197.

* cited by examiner

*Primary Examiner*—Peguy JeanPierre
(74) *Attorney, Agent, or Firm*—Koppel, Jacobs, Patrick & Heybl

(57) ABSTRACT

Unwanted voltage drops associated with the bit switches of a DAC are compensated with an output amplifier circuit for the DAC that includes a feedback circuit with a switch compensation resistance element that is connected in a combined series/parallel circuit with a feedback resistance circuit, so as to reduce both the size and associated capacitance of the resistance element.

33 Claims, 3 Drawing Sheets

US 6,633,246 B1

CONVERTER CIRCUIT WITH REDUCED AREA SWITCH COMPENSATION RESISTANCE

BACKGROUND OF THE INVENTION

1. Field of the Invention

This invention relates to converter circuits such as digital-to-analog converters (DACs), and more particularly to converters with a resistance element that compensates for voltage drops across the switches of the device's decrementing resistance network.

2. Description of the Related Art

A conventional DAC employing an R-2R decrementing resistor ladder is illustrated in FIG. 1. A number of equal value resistors having a common unit resistance R are connected in series with a voltage supply Vref, with rungs of the ladder tapped off the series circuit and having common resistance values equal to 2R, along with a terminal resistor of value 2R shown at the right end of the ladder. Each 2R resistor is connected to a respective bit switch S1, S2, S3 ... Sn for the first, second, third and nth bits of the DAC, with the terminal 2R resistor connected through a terminal switch St that is always ON. Each bit switch includes one pole that is grounded and active when the switch is OFF to divert the bit current to ground, and an output pole that is active when the switch is ON and connected to the output poles from each of the other switches to yield an accumulated output current Iout that represents the total currents flowing through each of the ON switches at any given time. The termination switch St is always connected to ground. In the example illustrated in FIG. 1, the switches S1, S3 and Sn for the most significant, third most significant and least significant bits, respectively, are illustrated as being ON, while the switch S2 for the second most significant bit is illustrated as being OFF, along with St. Iout is therefore equal to the sum of the currents flowing through S1, S3, Sn and any other bit switches that may be ON. The circuit as described thus far is well known, and is discussed for example in Cecil, "A CMOS 10-Bit D/A Converter", IEEE International Solid State Circuits Conf., February 1974, pp. 196–197.

A conventional control circuit for the ladder switches is illustrated in FIG. 2, in which digital signals from a digital input 2 are applied to a decoder 4 that decodes the digital input into control signals for the various ladder switches. Only the first bit switch S1 is shown in detail, but the other bit switches S2, S3 ... Sn are similar in design. In this example, the ladder switches are implemented by respective pairs of NMOS transistors N1 and N2, with the source of each transistor connected in common to the 2R resistor for that bit, the drain of N1 grounded, and the drain of N2 connected to contribute to Iout. Other types of FETs or bipolar transistors could also be used for the switches. The decoder 4 supplies control signals to the gates of N1 and N2, holding N1 ON and N2 OFF when the overall switch S1 is to be OFF, and holding N1 OFF and N2 ON when the overall switch S1 is to be ON. Similar pairs of control signals are supplied from the decoder to the transistor pairs of the other ladder switches.

Returning to FIG. 1, Iout is supplied to an output amplifier A1, preferably an operational amplifier (op amp) with its inverting input receiving Iout and its non-inverting input grounded. A feedback circuit is connected between the output and inverting input of op amp A1, with an effective feedback resistance Rfb typically having a resistance value equal to R. For more recent DACs with a larger number of bits than the 10 bit DAC described in the Cecil article mentioned above, a compensation resistance element Rsw has been added in series with Rfb to compensate for an error that appears in the full scale DAC output because of voltage drops across the bit switches. While this is not a particular problem for lower resolution DACs such as the 10 bit device discussed in the Cecil article, it does introduce a noticeable error for higher resolution devices such as present 16 bit DACs. When all the bit switches are ON, the output voltage is offset from the desired full scale value by the voltage across the least significant bit. To compensate for this, the compensation resistance element Rsw has been implemented as a dummy switch which is continuously ON when the op amp is operating, and has a resistance equal to half the resistance of the most significant bit switch S1. A CMOS device such as the NMOS switches employed in FIG. 1 basically functions as a small resistor for this purpose, with an ON resistance value that can be controlled by the device geometry and is also a function of the voltage supply Vref. Therefore, the compensation resistance element Rsw has been implemented as an NMOS transistor that is always ON and has an ON resistance equal to half the S1 resistance.

Previous DACs exhibited an additional error due to the fact that the resistors in the resistance ladder were characterized by a temperature coefficient of resistance (TCR) that was significantly lower than the TCR of the ON NMOS resistance, typically on the order of 50 ppm/° C. for the resistors vs. 4,000 ppm/° C. for the transistors. This introduced an additional error over an operating temperature range. Implementing Rfb with true resistor elements and Rsw with an NMOS transistor compensated for this TCR differential, in addition to compensating for the bit switch voltage drops.

While the resistance Rfb may be considered as a single effective resistance value for most purposes, in practice it has generally been implemented as a network of series and parallel individual resistor elements to spread the associated heat loss.

The dummy feedback switch Rsw is useful for the compensation purposes discussed above, but it introduces some problems of its own. To obtain a resistance value half that of S1, it has been implemented with a width twice that of S1. This makes Rsw quite large, which not only wastes die area, but also adds a degree of unwanted capacitance that can slow down the operation of the circuit and ultimately destabilize the op amp.

SUMMARY OF THE INVENTION

The present invention seeks to provide a DAC and associated amplifier with a feedback circuit that achieves a compensation equivalent to that of the prior art, but requires significantly less area and gains a corresponding reduction in parasitic capacitance.

These goals are achieved by providing a feedback circuit for the DAC's output amplifier that includes a compensation resistance element having a TCR within the range of the DAC bit switches, and connected in a combined series/parallel circuit with a feedback resistance circuit having a TCR within the range of the DAC ladder resistors. The resulting feedback circuit has an effective resistance approximately equal to the desired feedback resistance Rfb with a TCR within the ladder resistor TCR range, and an effective resistance with a TCR within the bit switch TCR range to at least approximately compensate for voltage drops across the switches.

In one embodiment of the invention, the feedback circuit for the DAC output amplifier includes a continuously ON compensation switch similar to the bit switches and having a resistance approximately equal to four times the resistance, and therefore approximately ¼ the area, of the resistance for the most significant bit switch. The feedback circuit further includes a first feedback resistance unit that is connected in a series circuit with the compensation switch, and a second feedback resistance unit that is connected in parallel with the series circuit, with the first and second feedback resistance units each having a resistance approximately equal to twice Rfb.

In a preferred implementation, the first and second feedback resistance units have similar layouts and are each smaller in size than a resistance circuit with a similar layout that would produce a resistance of Rfb; each feedback resistance unit can have an effective resistance of 2Rfb.

The compensation resistance element also preferably has a resistance substantially smaller than that of the first and second feedback resistance units, and can be implemented with an NMOS transistor that is continuously biased ON.

These and other features and advantages of the invention will be apparent to those skilled in the art from the following detailed description, taken together with the accompanying drawings.

DETAILED DESCRIPTION OF THE INVENTION

Figure 1:
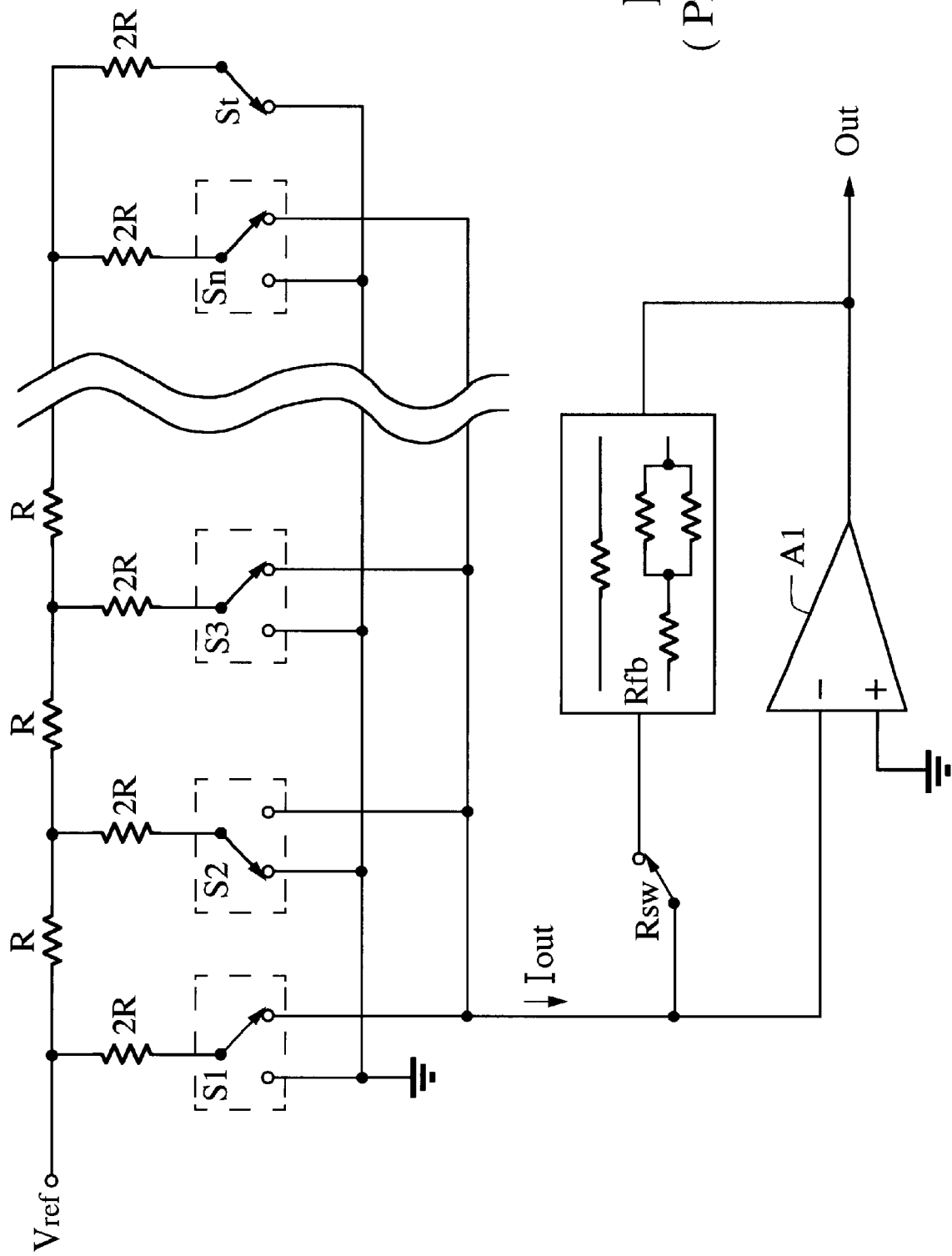
FIG. 1 is a schematic diagram of a prior art DAC circuit with a bit switch compensation scheme in the feedback circuit for its output amplifier.
Figure 3:
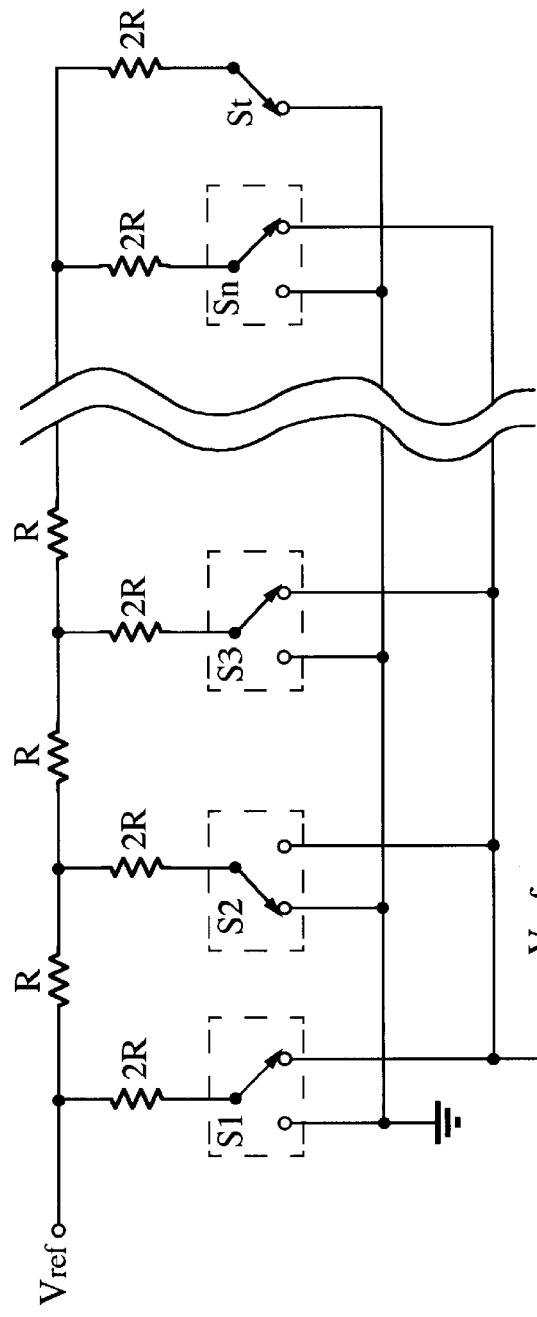
FIG. 3 is a schematic diagram of a DAC circuit in accordance with the invention that compensates for the effect of the bit switches but requires less area and produces less parasitic capacitance than the prior art circuits.
Figure 3:
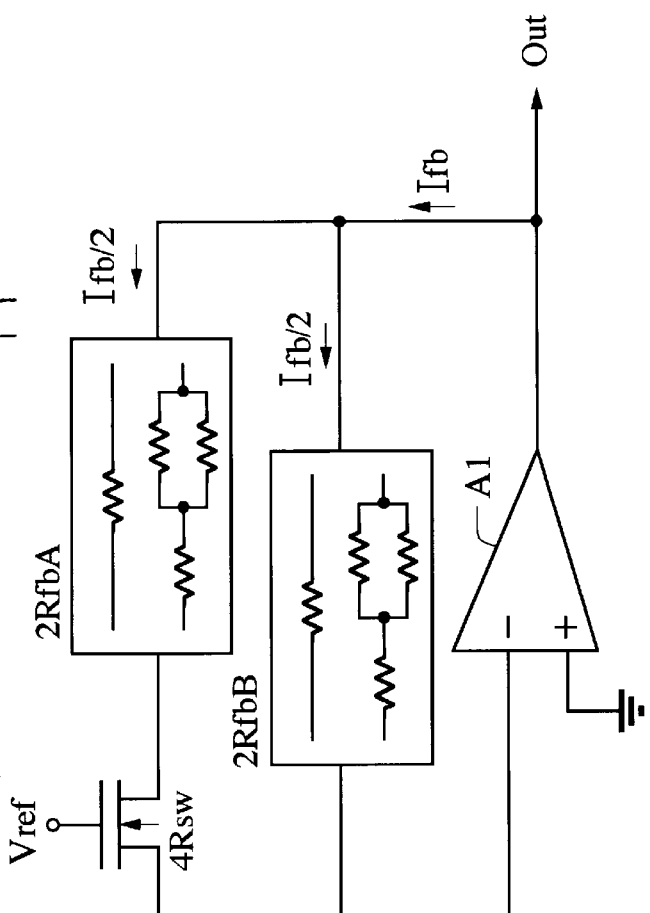

FIG. 3 illustrates an implementation of the invention in connection with the same DAC as FIG. 1, with common elements identified by the same reference symbols. The decrementing resistance network is the same as in FIG. 1, and suffers from the same size and parasitic capacitance problems associated with a conventional compensation dummy switch in the output amplifier feedback circuit. In the illustrated circuit, however, these problems are considerably reduced by implementing the compensation resistance element in the feedback circuit with a resistance equal to approximately four times the resistance of the first bit switch, rather than a resistance equal to that of the first bit switch as in the prior approach. This allows the size of the compensation resistance element to be ¼ that of the first bit switch, with an accompanying reduction in both the required die area and the associated parasitic capacitance.

This is made possible by connecting the compensation resistance element, which is identified as 4Rsw in FIG. 3, in a combined series/parallel circuit with a feedback resistance circuit for the output op amp A1, rather than in a simple series circuit as in the prior approach. As illustrated, the compensation resistance element 4Rsw is implemented as an NMOS transistor whose gate is connected to Vref to hold the transistor continuously ON while the op amp is operating. This implementation would preferably be used when the bit switches S1, S2, S3 ... Sn are also implemented as NMOS devices, which is commonly the case.

The compensation resistance element 4Rsw is connected in series with a first feedback resistance unit, designated 2RfbA. As in the prior design, this resistance unit can be implemented as a network of series and parallel resistance elements to spread heat loss, but its overall resistance is equal to twice the desired op amp feedback resistance, or 2Rfb. Many different configurations are possible, depending upon the desired overall resistance and the area available. Since its overall resistance is twice that of the desired feedback resistance, its individual resistance elements can be half as large as those used previously.

The series circuit consisting of 4Rsw and 2RfbA is connected between the output and inverting input of op amp A1 in parallel with a second feedback resistance unit 2RfbB, which also has a resistance approximately equal to twice the desired overall feedback resistance and can have a layout similar to that of 2RfbA.

The resistance associated with the 4Rsw NMOS device in its ON state is substantially less than that of Rfb, typically on the order of 30 ohms vs. 10 Kohms. Accordingly, the feedback current Ifb will divide approximately equally between the two feedback branches, with approximately half flowing through each branch. Although the compensation feedback NMOS device is only ¼ the size of the most significant bit switch S1 and therefore presents an ON resistance four times as great, its effect in the feedback circuit will be equivalent that of the Rsw compensation element in FIG. 1. This is because the 4Rsw element receives only approximately ½ the current as Rsw in FIG. 1, and further because it is in series with a resistance network having an effective resistance or 2Rfb, rather than Rfb as in FIG. 1. The net effect is to make the 4Rsw compensation element ¼ as effective as Rsw, therby yielding a net compensation resistance of approximately Rsw. Since its internal resistance is four times as great as Rsw, the new compensation element can have both an area and a capacitance approximately four times less.

While the new compensation scheme illustrated in FIG. 3 uses two feedback resistor networks rather than one, the elements of each individual network are approximately half the size (twice the resistance) as previously, so there is little or no corresponding increase in area. A typical value for 2Rfb is 20 Kohms, as opposed to 10 Kohms for previous designs, while a typical value for 4Rsw is 120 ohms, as opposed to a prior resistance of 30 ohms.

Still assuming that 4Rsw has a much lower resistance value than 2Rfb, the net resistance of the op amp feedback circuit in FIG. 3 will be approximately Rfb. Thus, both the effective low TCR resistance (Rfb) and the effective high TCR resistance (Rsw) of the new circuit will be approximately equal to the prior circuit, but both the required area and the added capacitance will be less.

Figure 4A:
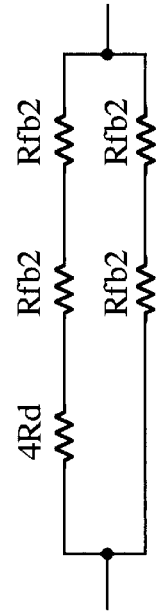
FIGS. 4a, 4b and 4c are schematic diagrams of more generalized embodiments of the amplifier feedback circuit.
Figure 4B:
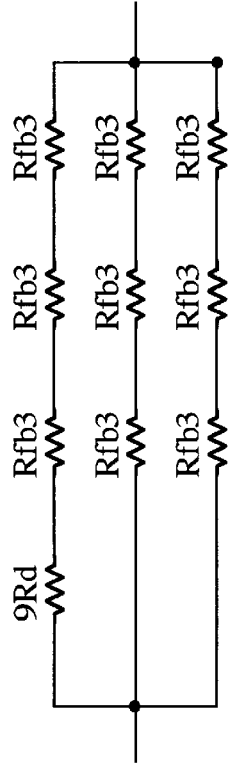
Figure 4C:
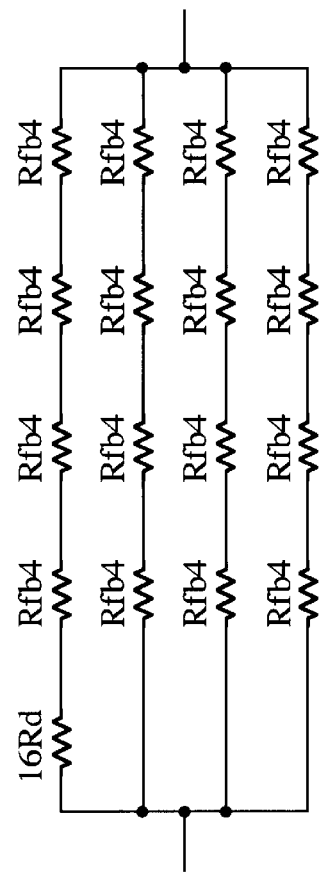
Figure 2:
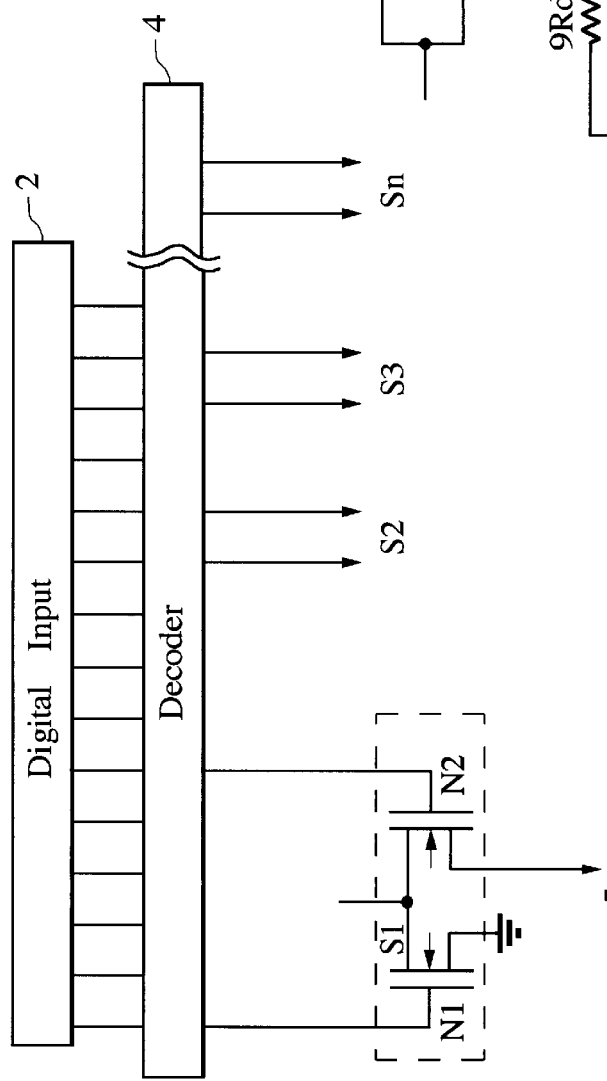
FIG. 2 is a partially schematic/partially block diagram of a prior art control scheme for the bit switches of the FIG. 1 circuit.

FIGS. 4a, 4b and 4c are more generalized embodiments of alternate amplifier feedback circuits, in which the feedback resistors are represented as an nxn array of resistors, with each individual resistor having a resistance value which gives the overall array the resistance value Rfb of the feedback resistor in the prior art circuit of FIG. 1. Each of the resistors in the array would typically also be implemented as an individual array of resistors for heat spreading. The resistance of the dummy switch Rsw in prior art FIG. 1 is represented in FIGS. 4a–4c as a resistance value Rd, using the generic resistor symbol to indicate that the dummy switch resistance can also be implemented by other kinds of resistors. FIG. 4a shows a 2×2 array, with two parallel branches having two feedback resistors Rfb2 each, one of the branches also including a dummy resistor with a value 4Rd connected in series with the feedback resistors of that branch. FIG. 4b illustrates a 3×3 array and FIG. 4c a 4×4 array, with respective feedback resistors Rfb3 and Rfb4, and respective dummy resistor values of 9Rd and 16Rd.

The resistance value R of the dummy resistor can be generalized as:

$$R = n^2 Rfb/[Rfb + (n-1)Rd].$$

In an actual implementation of this scheme, the series feedback resistors in any branch would normally be combined into a single resistor network. For example, the 2×2 feedback resistor of FIG. 4c would normally be implemented as the pair of feedback resistor networks 2Rfb1 and 2Rfb2 of FIG. 3.

To obtain the desired resistance value of Rfb for the overall feedback circuit (ignoring the much smaller dummy resistor value), the individual resistors in the feedback array would have a resistance value of $1/n(nRfb)^{1/(n-1)}$. Thus, the individual resistance values for Rfb2, Rfb3 and Rfb4 would be Rfb, $\frac{1}{3}(3Rfb)^{1/2}$ and $\frac{1}{4}(4Rfb)^{1/3}$, respectively. While the above analysis applies precisely for only one particular temperature, errors due to temperature nonlinearity would normally be quite small in practice.

While specific resistance values and ratios have been given for purposes for illustration, numerous variations are possible. For(example, any parallel feedback circuit which yields a low TCR equivalent to Rfb, could be used. In the case of three parallel feedback braches, the size of the switch compensation element could be reduced by a factor of approximately 5.1, although there would be some net increase in the overall size of the feedback resistors. Accordingly, it is intended that the invention be limited only in terms of the appended claims.

I claim:

1. A digital-to-analog converter (DAC), comprising:
   a voltage supply terminal,
   a multi-bit decrementing resistance network connected to said terminal and having resistance elements with temperature coefficients of resistance (TCR) within a first range,
   respective switches for the bits of said network, said switches having associated resistances with TCRs within a second range different from said first range,
   an output amplifier connected to receive an output signal from said resistance network, and
   a feedback circuit for said amplifier, comprising a compensation resistance element having a TCR within said second range for said resistances associated with said switches and connected in a combined series/parallel circuit with a feedback resistance circuit having a TCR within said first range for said resistance elements of said decrementing resistance network, said feedback circuit having an effective resistance with a TCR within said first range and approximately equal to a desired feedback resistance (Rfb) for said amplifier, and an effective resistance with a TCR within said second range to at least approximately compensate for voltage drops across said switches.

2. The DAC of claim 1, wherein said compensation resistance element is smaller in size than the switch for the most significant bit of said resistance network.

3. The DAC of claim 2, wherein said compensation resistance element has a greater resistance than the switch for the most significant bit of said resistance network.

4. The DAC of claim 3, wherein said compensation resistance element has a resistance approximately four times the resistance, and is approximately ¼ the size, of said most significant bit switch.

5. The DAC of claim 2, wherein said feedback resistance circuit comprises a first feedback resistance unit connected in a series circuit with said compensation resistance element, and a second feedback resistance unit connected in parallel with said series circuit.

6. The DAC of claim 5, wherein said first and second feedback resistance units each have a resistance greater than the desired feedback resistance (Rfb).

7. The DAC of claim 6, wherein said first and second feedback resistance units have similar layouts.

8. The DAC of claim 6, wherein said compensation resistance element has a greater resistance than the switch for the most significant bit of said resistance network.

9. The DAC of claim 8, wherein said compensation resistance element has a resistance approximately four times the resistance of said most significant bit switch.

10. The DAC of claim 9, wherein said first and second feedback resistance units each have a resistance of approximately two× the desired feedback resistance (2Rfb).

11. The DAC of claim 5, wherein said compensation resistance element has a resistance substantially smaller than the resistances of said first and second feedback resistance units.

12. The DAC of claim 1, wherein said switches and said compensation resistance element are each implemented with transistors of similar type.

13. The DAC of claim 12, wherein said switches and said compensation resistance element comprise respective FETs, with the FET which implements said compensation resistance element continuously biased ON during an operation of said DAC.

14. The DAC of claim 1, said output amplifier comprising an operational amplifier with said feedback circuit connected between its output and its inverting input, and its non-inverting input for connection to a reference voltage level.

15. A digital-to analog converter (DAC), comprising:
   a voltage supply terminal,
   a multi-bit decrementing resistance network connected to said terminal,
   respective switches for the bits of said network, said switches having respective associated resistances,
   an output amplifier connected to receive an output signal from said resistance network, and
   a feedback circuit for said amplifier, comprising a continuously ON compensation switch of similar type as said resistance network switches and having a resistance approximately equal to four times the resistance of the switch for the most significant bit in said resistance network, a first feedback resistance unit connected in a series circuit with said compensation switch, and a second feedback resistance unit connected in parallel with said series circuit, said first and second feedback resistance units each having a resistance approximately equal to twice a desired feedback resistance (Rfb) for said amplifier.

16. The DAC of claim 15, wherein said compensation switch is approximately ¼ the size of the switch for the most significant bit in said resistance network.

17. The DAC of claim 15, wherein said first and second feedback resistance units have similar layouts.

18. The DAC of claim 15, wherein said compensation resistance element has a resistance substantially smaller than the resistances of said first and second feedback resistance units.

19. The DAC of claim 15, wherein said resistance network switches and said compensation switch are each implemented with transistors of similar type.

20. The DAC of claim 19, wherein said transistors comprise NMOS transistors.

21. The DAC of claim 15, said output amplifier comprising an operational amplifier with said feedback circuit connected between its output and its inverting input, and its non-inverting input for connection to a reference voltage level.

22. An output amplifier circuit, comprising:

an operational amplifier (op amp) having a non-inverting input for connection to a reference voltage level, an inverting input for receiving an input signal, and an output, and a feedback circuit connected between the output and inverting input of said op amp, said feedback circuit comprising a resistance element having a temperature coefficient of resistance (TCR) within one range and connected in a combined series/parallel circuit with a feedback resistance circuit having a TCR within another range different from said one range, said feedback circuit having an effective resistance with a TCR within said other range for said feedback resistance circuit and approximately equal to a desired feedback resistance (Rfb) for said op amp.

23. The output amplifier circuit of claim 22, wherein said feedback resistance circuit comprises a first feedback resistance unit connected in a series circuit with said resistance element, and a second feedback resistance unit connected in parallel with said series circuit.

24. The output amplifier circuit of claim 23, wherein said first and second feedback resistance units each have a resistance greater than the desired feedback resistance (Rfb).

25. The output amplifier circuit of claim 24, wherein said first and second feedback resistance units have similar layouts.

26. The output amplifier circuit of claim 22, wherein said resistance element has a resistance substantially smaller than the resistances of said first and second feedback resistance units.

27. The output amplifier circuit of claim 22, wherein said resistance element is implemented with a transistor.

28. The output amplifier circuit of claim 27, said transistor comprising a FET that is continuously biased ON.

29. An output amplifier circuit, comprising:

an operational amplifier (op amp) having a non-inverting input for connection to a reference voltage level, an inverting input for receiving an input signal, and an output, and a feedback circuit connected between the output and inverting input of said op amp, said feedback circuit comprising a continuously ON switch having an associated resistance, a first feedback resistance unit connected in a series circuit with said switch, and a second feedback resistance unit connected in parallel with said series circuit, said first and second feedback resistance units each having a resistance approximately equal to twice a desired feedback resistance (Rfb) for said amplifier.

30. The output amplifier circuit of claim 29, wherein said first and second feedback resistance units have similar layouts.

31. The output amplifier circuit of claim 29, wherein said switch has an ON resistance substantially smaller than the resistances of said first and second feedback resistance units.

32. The output amplifier circuit of claim 29, wherein said switch is implemented with a transistor.

33. The output amplifier circuit of claim 32, said transistor comprising an NMOS transistor.

* * * * *